United States Patent [19]

Welsh

[11] Patent Number: 4,935,847
[45] Date of Patent: Jun. 19, 1990

[54] CIRCUIT SYSTEM WITH JACKSCREW INSTALLATION DEVICE

[75] Inventor: David E. Welsh, Tustin, Calif.
[73] Assignee: ITT Corporation, New York, N.Y.
[21] Appl. No.: 370,927
[22] Filed: Jun. 23, 1989
[51] Int. Cl.⁵ .............................................. H05K 7/14
[52] U.S. Cl. .................................. 361/415; 361/391; 361/392; 439/64; 439/248; 439/374; 439/377; 439/680
[58] Field of Search .................... 211/41; 254/41, 104; 361/386, 392, 388, 389, 390, 391, 394, 395, 399, 415; 403/409.1; 439/64, 248, 374, 377, 680, 681

[56] References Cited

U.S. PATENT DOCUMENTS

| | | | |
|---|---|---|---|
| 4,318,157 | 3/1982 | Rank et al. | 361/386 |
| 4,414,605 | 11/1983 | Chino et al. | 361/386 |
| 4,456,319 | 6/1984 | Ricros | 339/92 |
| 4,480,297 | 10/1984 | Jensen | 361/386 |

Primary Examiner—Gregory D. Thompson
Attorney, Agent, or Firm—Thomas L. Peterson

[57] ABSTRACT

A system is provided wherein a circuit module moves along an insertion path into a rack, and jackscrews are used to advance the module and mate multiple contacts on it and on the rack, which provides secure installation in a minimum of space. A jackscrew (46, FIG. 3) is rotatably mounted at the rear of a long module, and is coupled through a long torque member (60) to a drive member at the front of the module. The jackscrew member has a shoulder (106) that engages a shoulder (80) at the rear of the module, so insulation forces are applied to the rear of the module. The jackscrew member threadably connects to an internally-threaded jacksocket (52) on the rack which has an external precision guide surface (100) concentric with its internal threading. The module has a precision internal guide surface (94) that mates with the external guide surface on the rack before the jackscrews engage. Two jackscrew devices are located at the top and bottom of the rack, and may be connected so they turn together, but with a ratchet mechanism at each device to limit installation torque.

11 Claims, 7 Drawing Sheets

CIRCUIT SYSTEM WITH JACKSCREW INSTALLATION DEVICE

BACKGROUND OF THE INVENTION

Complex electronic equipment often includes a rack that holds many replaceable circuit modules. Each circuit module may contain one or more circuit boards with multiple integrated circuits and other interconnected components, and one or more connectors with multiple contacts at its rear end. A technician places the module on a track of the rack, and slides the module rearwardly until the contacts on the module lie close to corresponding contacts on the rack-mounted connector. An insertion-retention device is then operated to advance the module to its final position, to overcome the resistance of multiple mating contacts and the friction of guide surfaces such as formed by the interfitting connector housings. Only the front of the module is accessible for operating the device, and if the device pushes against the front of the module then the module must be made rigid, which adds to the cost. If the housings of the connectors on the module are relied upon for controlling the positions of the contacts to assure they mate with contacts of the rack-mounted connectors, then the contacts and other mating parts must be closely positioned with respect to the connector housing, which can be difficult. Furthermore, if the module contains two or more connectors, care must be taken to assure that the aligning surfaces for both connectors are accurately positioned with respect to each other. This is difficult, especially because minimum clearances are required on interfitting connector shells. In a vibration environment these clearances allow rapid sliding or "fretting" of the contacts which leads to premature failure. It is desirable that the insertion-retention device advance the top and bottom of the module in unison to avoid cocking of the module, and yet only a limited force should be applied to avoid damage if there is an obstruction. A circuit system which avoided the above disadvantage of prior systems, would be of considerable value.

SUMMARY OF THE INVENTION

In accordance with one embodiment of the present invention, a circuit system is provided with a jackscrew guiding and installation arrangement that enables accurate alignment of the mating parts of a circuit module with a rack, and which mates them in a reliable and secure manner. The module or its associated connector may have two jackscrew devices with threaded jackscrew members at its rear end that mate with jackscrew-engaging devices on the rack. A first jackscrew device is constructed with a drive member at the forward end of the module that can be turned as with a tool, and an elongated torque member extending between the drive member at the front end and the jackscrew member at the rear end to turn it. However, the jackscrew member at the rear end has a shoulder that engages a corresponding shoulder at the rear end of the module, so installing forces are applied to the rear of the module.

The module includes a precision guide surface concentric with the jackscrew member and which closely engages a corresponding precision surface on the rack that is also concentric with the jackscreW member.

The jackscrew member can slide a limited distance along its axis, and is urged forwardly by a spring. When the jackscrew member first mates with the jackscrew-engaging member on the rack, and the jackscrew member is turned, the jackscrew member advances by at least a complete turn before the shoulder on the jackscrew member engages the corresponding module shoulder to begin advancing the module.

Two jackscrew devices can be mounted on the module on the upper and lower parts thereof. Each jackscrew device includes a ratchet mechanism that limits the torque that advances the module in the rearward direction during installation to avoid cocking the module. A coupling mechanism can be used that couples the two jackscrew devices so they turn together.

In accordance with another embodiment of the invention, two jackscrew devices of the above construction are mounted directly on a connector that may or may not be part of a module.

The novel features of the invention are set forth with particularity in the appended claims. The invention will be best understood from the following description when read in conjunction with the accompanying drawings.

DESCRIPTION OF THE PREFERRED EMBODIMENT

Figure 1:
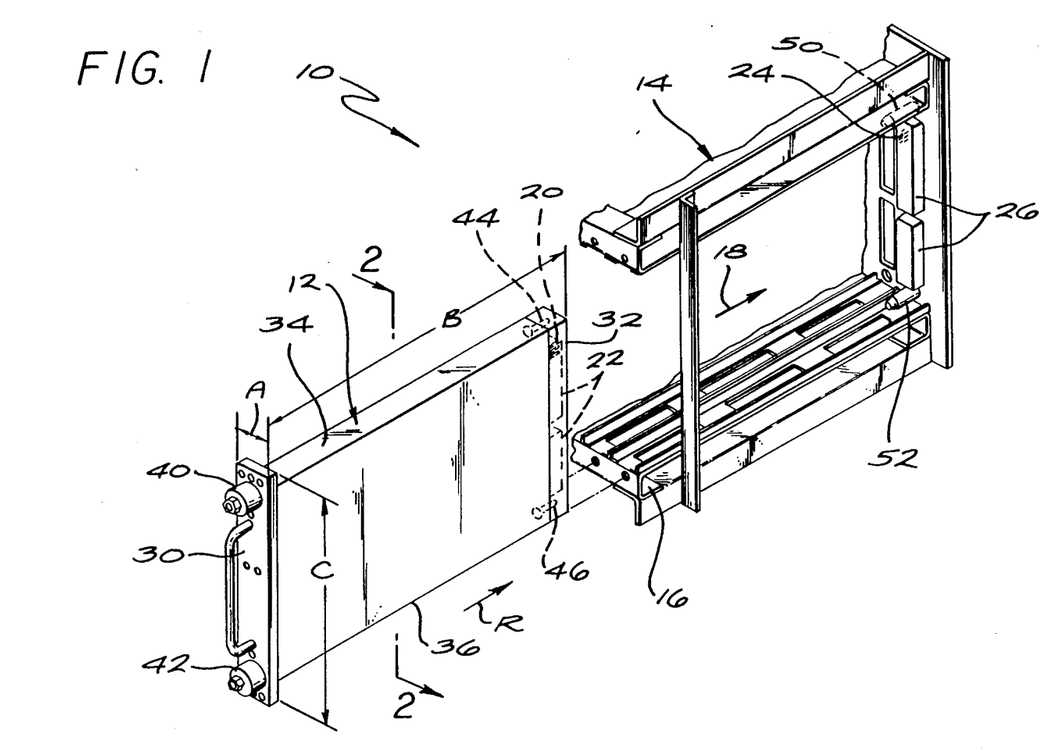
FIG. 1 is a perspective view of a circuit module system constructed in accordance with the present invention, with the circuit module ready for insertion into the rack.

FIG. 1 illustrates a circuit system 10 which includes a circuit module 12 and a frame or rack 14 which receives the module. The rack has tracks 16 which guide the module in rearward movement in the direction R as the module moves along an insertion path 18. Near the end of the module travel, multiple contacts 20 in one or more connectors 22 of the module mate with corresponding contacts 24 of connectors 26 on the rack. Substantial force may be required to fully install the module to mate all contacts simultaneously, and jackscrew devices are used to accomplish such final movement of the module in an accurately controlled manner.

The module has forward and rearward end portions 30, 32 and upper and lower parts 34, 36 (the upper and lower parts do not always have to be vertically spaced, and these terms are used to facilitate explanation). Upper and lower jackscrew devices 40, 42 have jackscrew members 44, 46 at the upper and lower parts of the rearward portion 32 of the module, and mate with jackscrew-engaging devices 50, 52 on the rack.

Figure 2:
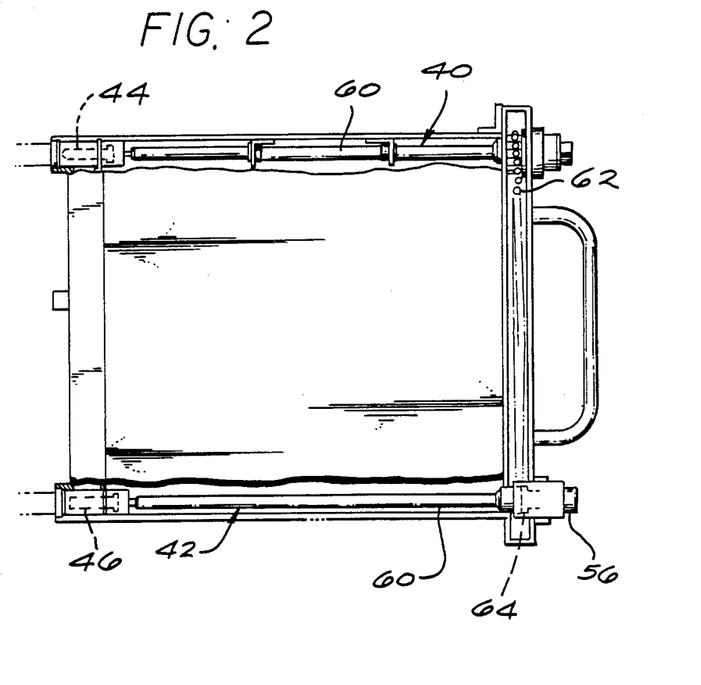
FIG. 2 is a sectional side view of the circuit module system take on line 2—2 of FIG. 1, with the circuit module fully installed on the rack.

As shown in FIG. 2, each jackscrew device such as 42 includes a drive assembly with a rotatable drive member 56 at the front of the module that drives an elongated torque member 60 extending along most of the length of the module. The rearward end of the torque member drives the jackscrew member or jackscrew 46. A coupling mechanism 62 connects the upper and lower jackscrew devices 40, 42 to drive them in synchronism, which avoids cocking of the circuit module. Each jackscrew device includes a torque-limiting ratchet mechanism 64 that limits the torque that can be applied to each corresponding jackscrew 44, 46 when it is turning in a clockwise direction to secure the module, to avoid damage to either jackscrew device or to the module.

Figure 3:
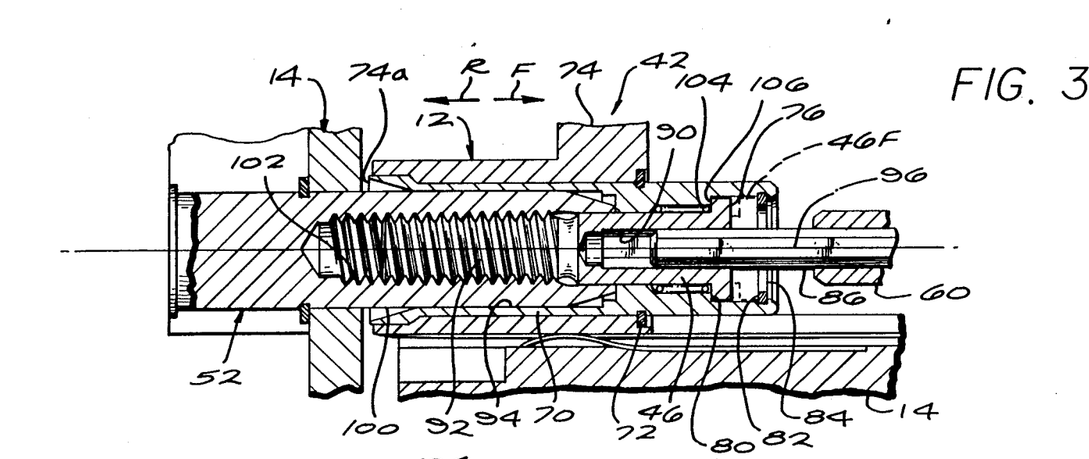
FIG. 3 is a sectional side view of a rearward portion of the system of FIG. 2, with the module fully installed on the rack.
Figure 4:
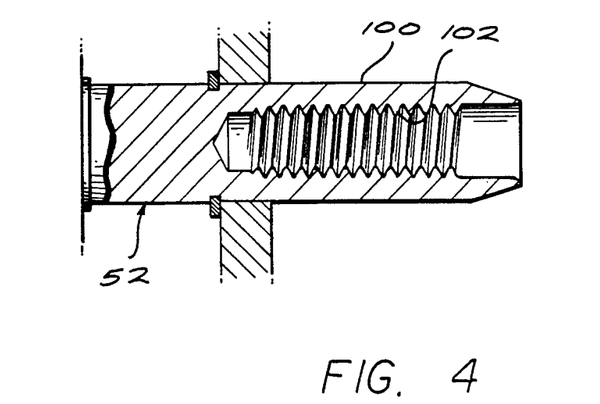
FIG. 4 is a view of the rack portion of the system of FIG. 3.
Figure 5:
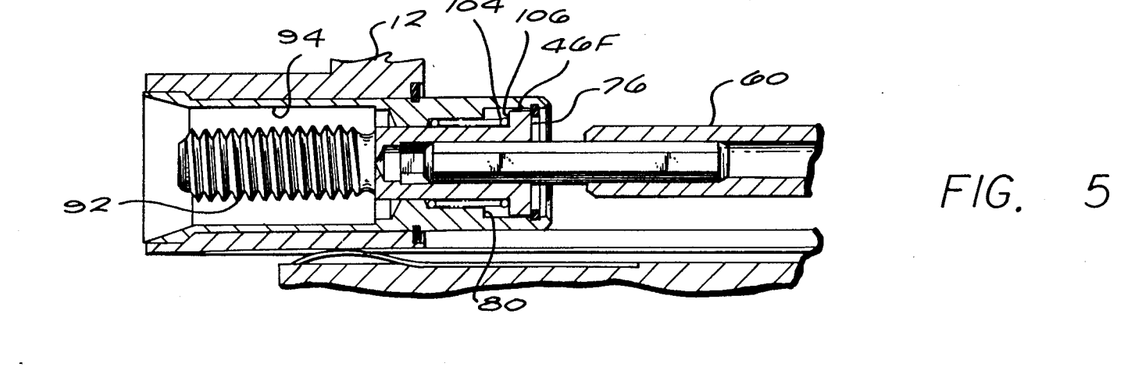
FIG. 5 is a view of the module portion of the system of FIG. 3.

FIGS. 3-5 illustrate details of the rearward end portion of the lower jackscrew device 42. A guide member or bushing 70 is held by a snap ring 72 to the rest of the housing 74 of the module. The jackscrew 46 lies largely within the guide bushing but is able to slide in forward and rearward directions F, R therewithin. Shoulders 80, 82 on the guide member and on a snap ring 84 limit the travel of the jackscrew. A hexagonal insert 86 at the rear of the torque member 60 is slideably received within an hexagonal recess 90 in the front end of the jackscrew, to enable turning of the jackscrew as it advances. The rear portion 92 of the jackscrew is threaded (it could have internal threads that receive external threads on a rack device). The guide bushing 70 has an internal precision guide surface 94 which is concentric with the axis 96 of the jackscrew. Inasmuch as the guide member 70 does not move relative to most of the module 12, the guide member 70 can be considered to be part of the housing 74.

The jackscrew-engaging device or jacksocket 52 which is mounted on the rack 14, has a precision external guide surface 100 which is closely received within the internal precision guide surface 94 of the module 12. The jacksocket also has an internally threaded hole 102 which threadably engages the rear portion of the jackscrew. During insertion of the module 12, as it approaches its final position, the guide surface 100 of the jacksocket is received in the guide surface 94 on the module to accurately align the module with the rack in lateral and vertical directions. As the module is moved further rearward, the rear end of the threaded portion of the jackscrew engages the front portion of the threaded hole 102 of the jacksocket 52. The module cannot be simply pushed rearward any further. At this time, the torque member 60 of the lower jackscrew device 42 is turned to turn the jackscrew 76 to screw it into the threaded hole 102.

The jackscrew is initially maintained in a forward position indicated at 46F by a spring 104. When the rear end of the jackscrew has engaged the threaded hole 102, and the jackscrew is turned, it advances until a rearwardly-facing shoulder 106 on the jackscrew engages the forwardly-facing shoulder 80 on the guide bushing of the module. Further turning of the jackscrew results in it pressing rearwardly on the shoulder 80 of guide bushing 70, so that the jackscrew advances the module in the rearward direction. The shoulder is much closer to the extreme rearward end 74a of the module housing, than to the extreme forward end 74b (FIG. 6) thereof. During such advance, the multiple contacts on the module and rack connectors engage one another. The jackscrew continues to turn until stop surfaces (not shown) on a module connector abut corresponding surfaces on a rack connector to prevent further rearward movement of the module. The module is then fully installed.

The fact that the jackscrew can slide a limited distance, helps protect the jackscrew. When the jackscrew is first turned, very little of the threads on the jackscrew and the jacksocket 52 are engaged. If the jackscrew then has to advance the module, there is a possibility that the extreme end of the thread will be stripped. However, in the illustrated arrangement, the only resistance to rearward movement of the jackscrew is the bias of the spring 104, which results in avoiding such thread stripping. The jackscrew turns about three full turns while its threads are engaged with those of the jacksocket, before the jackscrew bears against the module shoulder 80 to begin advancing the module. With about three full turns of thread engaged, stripping of the threads is very unlikely. It is desirable that at least about one full turn of the jackscrew thread be threadably engaged with the jacksocket before the jackscrew has to advance the module thus, the jackscrew can travel a distance at least as great as the distance between adjacent threads on the jackscrew before engaging the shoulder 80.

Figures 6, 7:
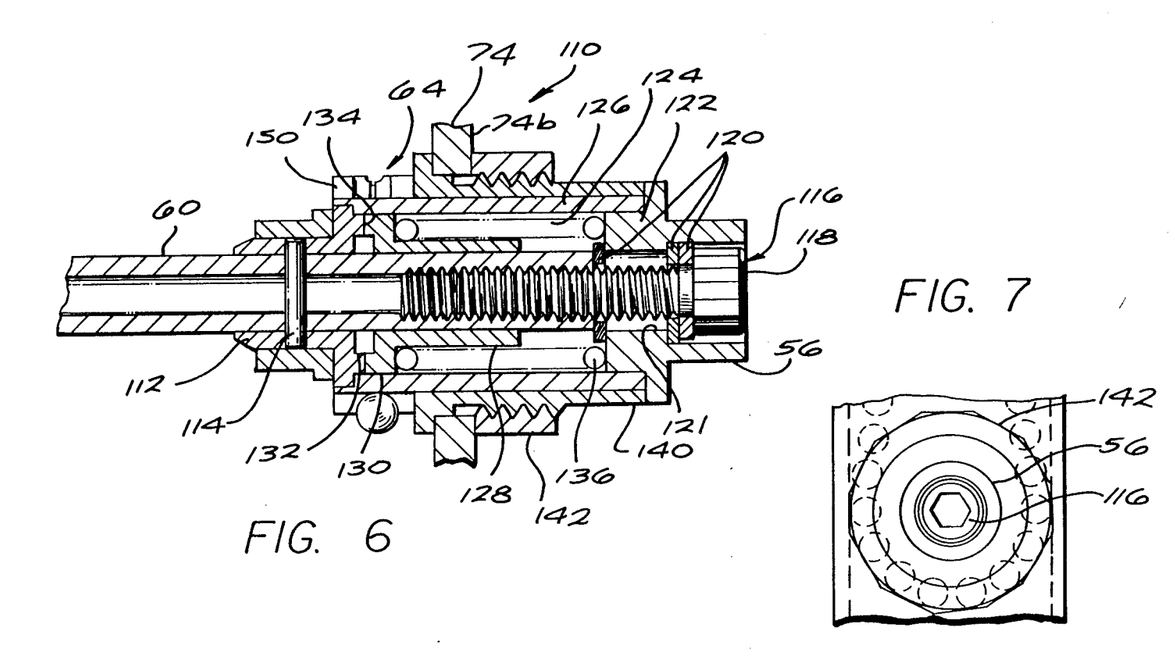
FIG. 6 is a sectional view of a forward portion of the circuit system of FIG. 2.
FIG. 7 is a front elevation view of a portion of the module of FIG. 2.

FIG. 6 illustrates details of the drive 110 which couples the drive member 56 to the torque member 60 that turns the jackscrew. The drive 110 includes the ratchet mechanism 64 that comprises a ratchet member 112 fixed by a pin 114 to the torque member 60, which is a tube. The drive member 56 is held by a screw 116 that has a head 118 that abuts the drive member to hold it in place, and that has a rear end threadably engaged with a threaded hole in the torque member 60. A set of washers 120 allow the screw 116 and torque member 60 to remain stationary while the drive member 56 is turned. The drive member 56 has a hexagonal rearward part 122 which is engaged with an internal hexagonal hole 124 in a sprocket 126. Thus, as the drive member 56 is turned, it turns the sprocket 126. A ratchet insert 128 has a hexagonal outer surface 130 at its rearward end which is engaged with the hexagonal hole 124 in the sprocket, so the ratchet insert 128 also turns as the drive member 56 turns. The rearward face 132 of the ratchet insert has ratchet teeth that engage corresponding teeth on the forward face 134 of the ratchet member 112. When the drive member 56 is turned in a clockwise direction (when viewing the front end of the module) the ratchet teeth on the faces 132, 134 can slip on one another. The torque that can be transmitted between them depends upon the force of a spring 136 that urges the ratchet insert 114 rearwardly (as Well as the slope of the ratchet teeth and friction). However, when the drive member 56 is turned counterclockwise to remove the module, the ratchet teeth lock together at a greater angle and a higher torque can be transmitted. The spring 136 is chosen so that the maximum torque applied for final insertion of the module is sufficient to insert the module when all parts are aligned, but which allows the ratchet teeth faces to slip when the module is cocked or an obstruction is encountered.

It may be noted that the sprocket 126 rotates within a panel bushing 140 that is held by a retaining nut 142 to the front panel of the module housing 74. The drive member 56 has a hexagonal outer surface, and can be driven by a socket wrench.

Figures 8, 9:
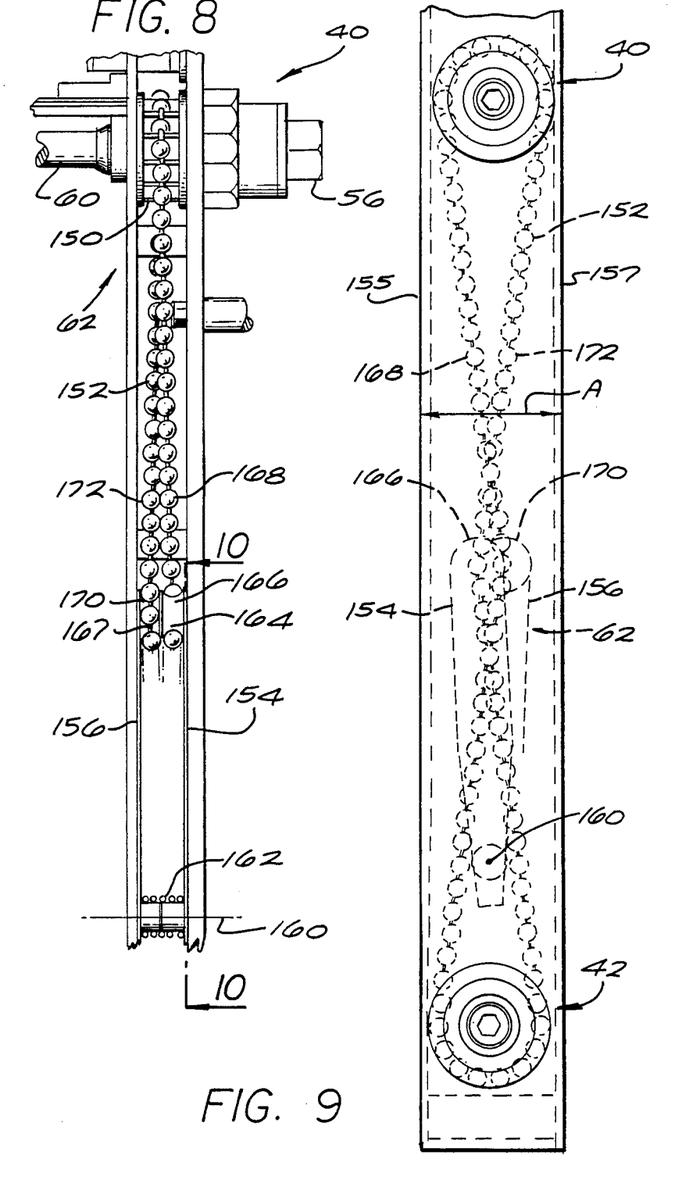
FIG. 8 is a sectional side view of the circuit module system of FIG. 2, showing part of the coupling mechanism thereof.
FIG. 9 is a front view of the coupling mechanism.
Figures 10, 11:
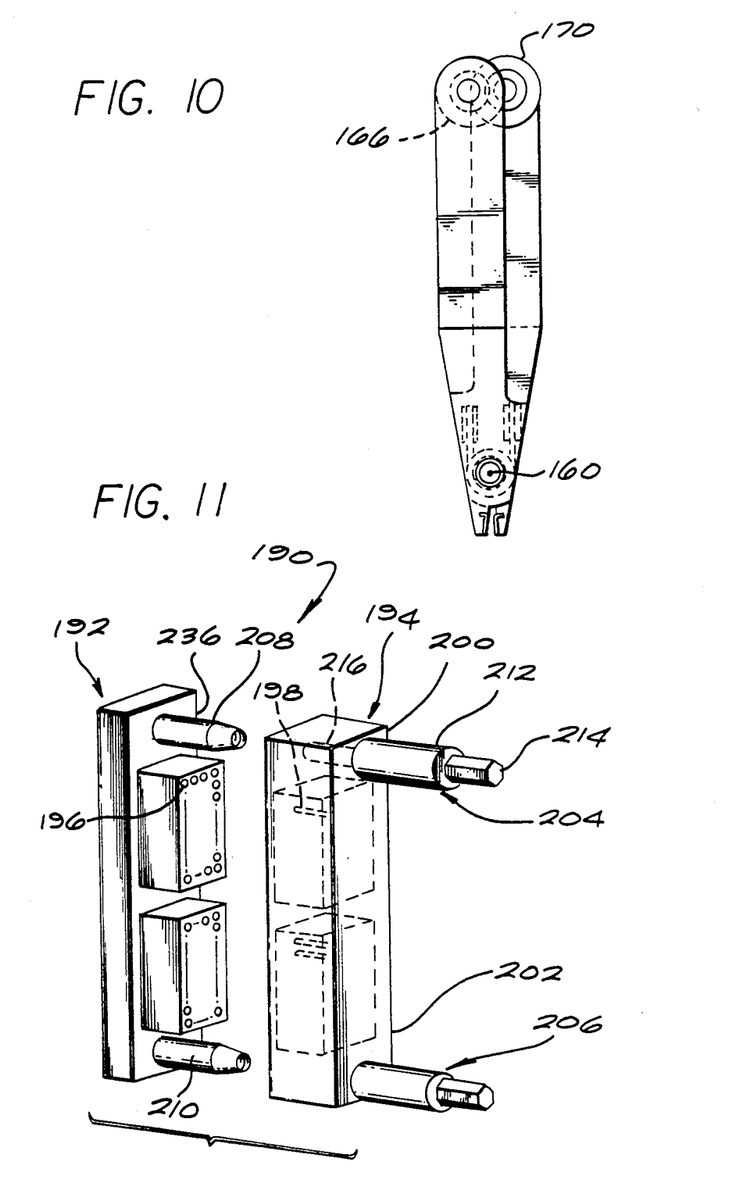
FIG. 10 is a view taken on the line 10—10 of FIG. 8.
FIG. 11 is a perspective view of a connector system constructed in accordance with another embodiment of the invention, with the connectors separated.

FIGS. 8–10 illustrate details of the coupling mechanism 62 which couples the upper and lower jackscrew devices 40, 42 so their jackscrews turn in synchronism to avoid cocking the module. Each jackscrew device such as 40 has a sprocket wheel 150 engaging a belt or chain 152. Each sprocket wheel is fixed to the sprocket 126 of each drive, so that each sprocket wheel rotates when a corresponding drive member 56 is turned. Also, the rotational torque of each sprocket wheel is transmitted through a ratchet mechanism to the torque member, there being a ratchet mechanism in both the upper and lower jackscrew drives. A variety of coupling mechanisms can be used to couple the jackscrew devices, besides a chain.

It is necessary to maintain a moderate tension in the chain or belt 152. However, the module has a narrow width A between its opposite sides 155, 157, and an even narrower free space for movement of a tension arm. Applicant uses two tension arms 154, 156 to tension the chain. The two arms pivot about an axis 160 and are urged to pivot in opposite directions by a torsion spring 162. Arm 154 carries a roller 166 that engages one largely vertical side 168 of the chain, while arm 156 carries a roller 170 that engages an opposite largely vertical side 172 of the chain, that lies in another plane. The use of two tension arms which engage the chain in different planes 164, 167 and which are urged to pivot in opposite directions, enables the maintenance of tension in a restricted space.

Applicant has constructed a module system of the type illustrated and described, with the module having a length B (FIG. 1) of 12.5 inches, a height C of 8.3 inches, and a width A of 0.95 inch. This is a "long" module because the length B is more than half the height C. The precision guide surface 100 (FIG. 4) had a diameter of 0.4022 inch (with a maximum variation in diameter of four ten-thousandths inch), and the clearance between the guide surfaces 100, 94 was 2 mils (one mil equals one thousandth inch). The jackscrew had a diameter of one-quarter inch and threads of a pitch of 20 per inch. The contacts of the module and of the rack were both located with precision with respect to the precision guide surfaces.

Figure 12:
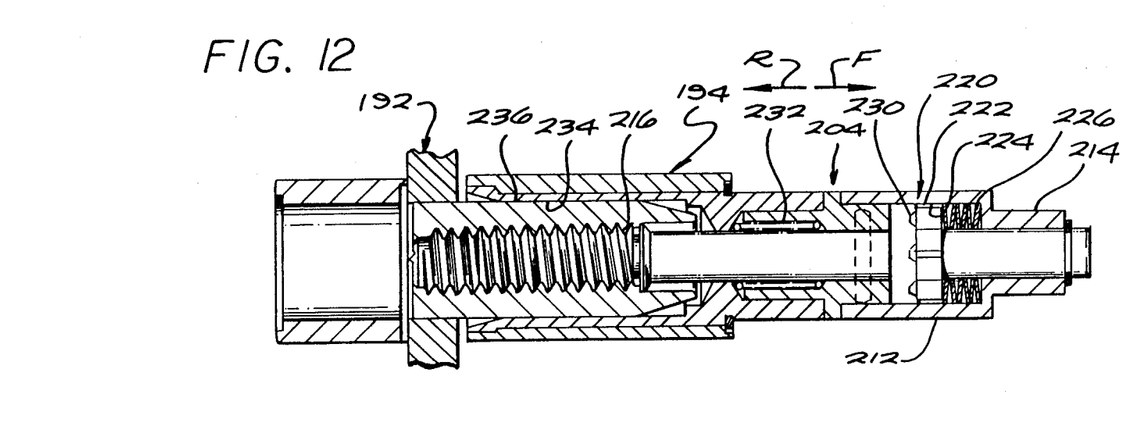
FIG. 12 is a partial sectional side view of the connector system of FIG. 11 with the connectors fully mated.
Figure 13:
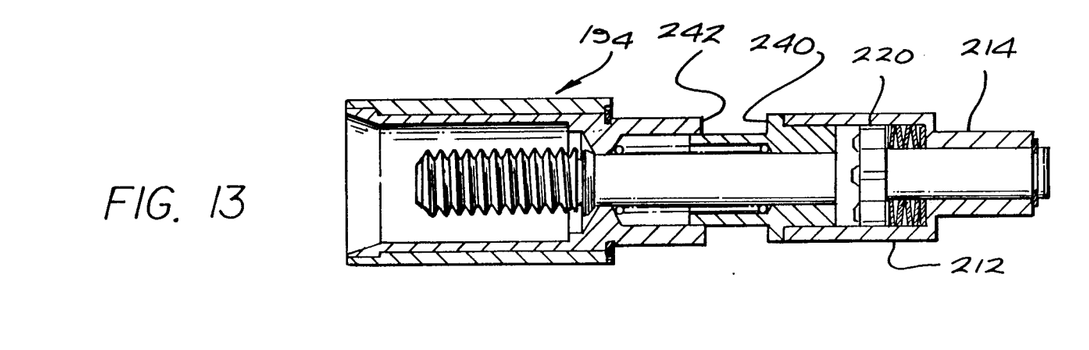
FIG. 13 is a partial sectional side view of only one connector of FIG. 12.

FIGS. 11–13 illustrate a connector system 190 of another embodiment of the invention, with male and female connector parts 192, 194 that carry mating contacts 196, 198. The female part 194 has opposite end portions 200, 202 that carry jackscrew devices 204, 206 that mate with jackscrew-engaging devices or jacksockets 208, 210 on the male connector part. Each jackscrew device 204, 206 includes a drive member 212 with a hexagonal projection 214, which can be turned to turn a jackscrew 216.

As shown in FIGS. 12 and 13, the jackscrew device 204 includes a ratchet mechanism 220 which couples the drive member 212 to the jackscrew 216. The mechanism includes a ratchet insert 222 lying in an hexagonal hole 224 in the rearward portion of the drive member 212 and which is biased rearwardly by Belville springs 226. The ratchet insert 222 has ratchet teeth on its rearward face that engage corresponding teeth on a circular member 230 that is fixed to the jackscrew 216. The jackscrew 216 and ratchet mechanism 220 can move rearwardly and forwardly by a limited distance. A spring 232 urges them forwardly to the position shown in FIG. 13.

When the male and female connector parts 192, 194 are moved together, guide surfaces 234, 236 engage and then the jackscrew engages the jacksocket and prevents further rearward movement of the connector part 194. Turning of the drive member 212 to turn the jackscrew then causes the jackscrew to advance by at least one turn, until a shoulder 240 coupled to the jackscrew engages a shoulder 242 coupled to the rest of the female connector part 194 to advance the contacts into mating engagement.

Thus, the invention provides a circuit system of the type wherein a circuit module or connector part, each of which is referred to as a module herein, is installed in a rack or corresponding connector part, each of which is referred to as a frame herein. The system is of the type wherein the module is moved by a jackscrew along the last portion of its travel during which the contacts mate, and it assures precision locating of the contacts and the reliable installation and removal of the module in a relatively compact and reliable mechanism. In the case of a long module, the jackscrews that advance the module at the end of its movement, bear against shoulders on the module housing which are located at the rear end of the long module, but are rotated by a drive which receives driving forces at the front of the long module. The jackscrew has a shoulder for pushing against the module, which is initially located forward of the module shoulder; this assures that the jackscrew threads are securely engaged before the jackscrew must advance the module and overcome the resistance due to mating of multiple contacts and other sources. Precision guide surfaces which assure accurate location and alignment of the module with the rack, are located concentric with the axes of the jackscrews. Each jackscrew device has a ratchet mechanism that limits the torque applied in a direction to advance the module rearwardly. A coupling mechanism can couple the upper and lower ratchet mechanism so the jackscrews turn in unison.

Although particular embodiments of the invention have been described and illustrated herein, it is recognized that modifications and variations may readily occur to those skilled in the art and consequently it is intended to cover such modifications and equivalents.

What is claimed is:

1. In a circuit system wherein a circuit module with a plurality of first contacts is moved in a rearward direction along an insertion path to install it on a frame with a plurality of second contacts, the improvement comprising:

a rotatable jackscrew mounted on said module;

a jackscrew-engaging device with internal threads positioned on said frame to receive said jackscrew, said jackscrew-engaging device having a precision outer guide surface concentric with said internal threads;

said module having an internal precision guide surface which is concentric with said jackscrew and which closely receives said outer guide surface when said jackscrew approaches and is threaded into said jackscrew-engaging device.

2. The improvement described in claim 1 wherein:

said jackscrew has a rearwardly-facing shoulder and an axis and is slideable along said axis, said module forms a forwardly-facing shoulder that abuts said jackscrew shoulder when said jackscrew as slid forward, and including a spring urging said jackscrew forwardly, said jackscrew being slideable forwardly far enough that during installation said jackscrew turns by at least about one turn while its threads are threadably engaged with the threads of said jackscrew-engaging device, before said module and jackscrew shoulders are engaged, whereby to avoid damage to said threads.

3. The improvement described in claim 1 including:
a drive assembly having a rotatable drive member coupled to said jackscrew; and
a second jackscrew, a second jackscrew-engaging device with a second outer guide surface, and a second module internal guide surface, all similar respectively to said first mentioned jackscrew, said first mentioned jackscrew-engaging device, and said first mentioned internal guide surface;
said module having upper and lower parts and said first and second jackscrews located respectively at said upper and lower parts;
a mechanism coupling said first and second drive members so rotation of said first drive member urges rotation of both of said jackscrews.

4. The improvement described in claim 3 wherein:
said mechanism includes first and second torque-limiting ratchet mechanisms coupled respectively to said first and second jackscrews to limit the torque applied to each jackscrew but allow one jackscrew to continue to be rotated even when the other encounters high resistance to rotation.

5. In a circuit system wherein a narrow circuit module with upper and lower parts, front and rear end portions, and first and second opposite sides, is moved rearwardly along an insertion path to install it on a rack having jackscrew-engaging devices, the improvement comprising:
upper and lower jackscrew devices mounted on said module, each including a jackscrew at said rear portion of said module for threadably engaging a corresponding one of said jackscrew-engaging deices;
a coupling mechanism which couples said upper and lower jackscrew devices to turn them in synchronism, each jackscrew device including a sprocket wheel coupled to the corresponding jackscrew, and said coupling mechanism including a chain device extending between and around said sprocket wheels, said chain device having first and second largely vertical sides extending between said sprocket wheels to turn both of them in the same direction at the same time;
said coupling mechanism also including a pair of tension arms, each having an inner end pivotally mounted on said module and an outer end having a roller that bears against a different one of said largely vertical sides of said chain device, said tension arms being spring biased so said rollers urge said first and second sides of said chain device respectively towards said second and first sides of said module.

6. The improvement described in claim 5 wherein:
each of said jackscrew devices includes a torque member coupled to a corresponding jackscrew to turn it, and a ratchet mechanism coupling a corresponding socket wheel to a corresponding torque member, each ratchet mechanism transmitting only a limited torque between the sprocket wheel and corresponding torque member for one direction of rotation.

7. In a circuit system wherein a circuit module with upper and lower portions and a plurality of first contacts is moved in a rearward direction along an insertion path to install it on a frame with upper and lower portions and a plurality of second contacts, the improvement comprising:
upper and lower jackscrew devices located respectively at said upper and lower portions of said module, each including a jackscrew;
upper and lower jackscrew-engaging devices located respectively on said upper and lower portions of said frame, each threadably engageable with one of said jackscrews;
each jackscrew device having a drive member that can be manually turned, and a ratchet mechanism coupling a drive member to a corresponding jackscrew and limiting the torque that can be transmitted as a jackscrew is further threaded into a jackscrew-engaging device.

8. The improvement described in claim 7 wherein:
each jackscrew device and corresponding jackscrew-engaging device has threads and a precision guide surface concentric with the threads and which mates with the other corresponding precision guide surface.

9. In a circuit system wherein a circuit module with a plurality of first contacts is moved in a rearward direction along an insertion path to install it on a rack that has a plurality of second contacts that mate with the first contacts, and wherein the circuit module has widely-spaced rearward and forward end portions, with said first contacts mounted at said rearward end portion, the improvement comprising:
at least one jackscrew device located on said circuit module and having a rotatable jackscrew at said rearward module end portion, said rack having a first threaded jackscrew-engaging device that threadably mates with said jackscrew as said jackscrew rotates;
said jackscrew device having a drive member at said forward end portion of said module, and also having an elongated torque member extending between said rearward and forward end portions and coupled respectively to said jackscrew and to said drive member, so as said drive member is rotated it rotates said elongated torque member and said jackscrew;
said module forming a forwardly-facing shoulder at said rearward end portion, said module shoulder lying around said jackscrew, and said jackscrew having a rearwardly-facing shoulder that engages said module shoulder, to apply insertion forces at the rear portion of the module;
said jackscrew is slideable along its length between a rearward position wherein said jackscrew rearwardly-facing shoulder engages said module shoulder, and a forward position, wherein said jackscrew rearwardly-facing shoulder lies forward of said module shoulder, and including a spring urging said jackscrew toward said forward position, the travel of said jackscrew between said forward and rearward positions being at least as great as the distance between two adjacent threads on said jackscrew, whereby to enable the jackscrew to screw into said jackscrew-engaging device by at least one turn before said jackscrew shoulder engages said module shoulder.

10. The improvement described in claim 9 wherein:
said module has upper and lower parts and said jackscrew device lies at said lower part, and including a second jackscrew device substantially identical to said first named jackscrew device but located at said upper part;
said module includes a coupling mechanism coupling said first and second jackscrew devices so rotation of said drive member causes simultaneous rotation of said first and second jackscrew members.

11. The improvement described in claim 10 wherein:
said second jackscrew device has a second jackscrew and a second elongated torque member extending between said coupling mechanism and said second jackscrew, and each of said jackscrew devices includes a torque-limiting ratchet mechanism which limits the torque applied to the corresponding jackscrew during rotation thereof in a direction to install said module on said rack.

* * * * *